United States Patent [19]
Carlstedt

[11] Patent Number: 5,355,293
[45] Date of Patent: Oct. 11, 1994

[54] LOW-VOLTAGE DC POWER SUPPLY

[75] Inventor: L. Gunnar Carlstedt, Partille, Sweden

[73] Assignee: Carlstedt Elektronik AB, Gothenburg, Sweden

[21] Appl. No.: 844,988

[22] Filed: Feb. 28, 1992

[30] Foreign Application Priority Data

Mar. 1, 1991 [SE] Sweden .................. 9100595-9

[51] Int. Cl.$^5$ ............................. H02M 3/335
[52] U.S. Cl. .............................. 363/17; 363/98; 363/132; 307/83
[58] Field of Search ............ 363/17, 72, 98, 132; 307/52-58, 80, 81, 83, 85

[56] References Cited

U.S. PATENT DOCUMENTS

| | | | |
|---|---|---|---|
| 4,338,658 | 7/1982 | Toy | 363/72 |
| 4,399,499 | 8/1983 | Butcher et al. | 363/17 |
| 4,547,961 | 10/1985 | Bokil et al. | 29/602 R |
| 4,953,068 | 8/1990 | Henze | 363/17 |

FOREIGN PATENT DOCUMENTS 0264110 4/1988 European Pat. Off. .
906831 7/1949 Fed. Rep. of Germany .

Primary Examiner—Steven L. Stephan
Assistant Examiner—Adolf Berhane
Attorney, Agent, or Firm—Young & Thompson

[57] ABSTRACT

A low-voltage DC power supply, e.g. 5 V output, is fed from a higher-voltage input DC source, e.g. 300 V. A plurality of switched transformers each comprise a primary winding (L1) for switchably connecting to the input, a secondary winding (L2) for switchably connecting to the output, electronic switches (M1-M8) for alternatingly switching the windings (L1, L2) in opposite polarities, and common control means (10) for performing the switching such that in the plurality of transformers, no two thereof are simultaneously switching. For removing the influence of rapid output current surges, a filter (L9, L10, C10-C12) is arranged on the input side.

27 Claims, 6 Drawing Sheets

LOW-VOLTAGE DC POWER SUPPLY

The invention regards a device for obtaining a low-voltage DC supply from a higher-voltage DC source.

The standard way of obtaining low voltage DC supply for various electronic circuits has been to transform the AC mains voltage in a transformer, obtaining a low-voltage AC, which is then rectified. This solution has drawbacks when high currents and powers are demanded, in that large-area conductors are needed from the necessarily centralized supply unit, and the efficiency is generally low with high power losses, which must be removed by cooling.

It is a general object of the invention to obtain a low-voltage DC supply which is sufficiently small to be placed closes to its load, avoiding long large-area conductors.

Another object is to obtain a DC power source at low voltage, which can withstand high-frequency surges of current without creating disturbances on the mains circuit.

A third object is to obtain a low-voltage DC supply having low losses.

SUMMARY OF THE INVENTION

Those and other objects and advantages are obtained, according to the invention, by means of a low-voltage DC power supply having a high DC voltage input and a low DC voltage output, and which comprises a plurality of transforming units, each said unit having terminals connected to each of said DC input and output, each said unit comprising a transformer core provided with a primary winding for connecting to said DC voltage input, a secondary winding for connecting to said DC voltage output, and a connection network comprising controllable switch means for connecting said DC voltage input switchably with alternating polarity to said primary winding, under the control of a clock pulse sequence, and for connecting said DC voltage output switchably with alternating polarity to said secondary winding, under the control of the same said clock pulse sequence, said plurality of transforming units being commonly controlled for switching such that when one transformer unit is switching, at least another transformer unit is nonswitching.

According to a preferred embodiment, there is for each of the plurality of units a primary bridge having four controllable switches and at least one secondary bridge, also comprising four controllable switches.

In a representative example, such a power supply may be fed from a 300 V DC source and feed out 5 V DC. If there is a rapid surge current on the output, a similar surge will be felt on the input side. This surge may be effectively taken up by a capacitor and/or inductor network at the 300 V input, which may have a capacitance some 3600 times smaller than a capacitor having the same surge damping effect but connected at the output side of the device. Further, that same damping effect would be difficult to obtain at the required high capacitance, in view of the series inductance value necessarily present in a low-voltage very large capacitor.

In accordance with a preferred embodiment, two transforming units are joined in a common component, with transformer cores of ferrite and coils, switch means and control circuits mounted on polymer foils to a cooling fin of appropriate form.

It is preferred to arrange for control circuits to provide for the handling of overload conditions, as well as for conditions of low load, when the connections between input/output and the respective windings may be disconnected for short times, the DC output voltage being substantially held by the input capacitance of the load, or by an added parallel capacitor in the output.

Although for certain applications, it may be sufficient to have only two transforming units, working in time offset so that one is always active in delivery when the other is switching, in other applications, the number may be higher, whereby at most only one of them is switching at any time. The loss due to one transforming unit failing to deliver during switching will then be taken up by a plurality of other transforming units.

It is preferred to include in the connection network a plurality of auxilliary windings for providing the necessary switching control power and the power for control circuits. In order to enable starting, the control circuits for switching the primary winding may be fed from the input DC voltage, but the power for the control circuits for switching the secondary winding may be wholly obtained from auxiliary windings. The whole power supply is then self-sufficient, only the input DC feed being necessary. The output DC voltage may be galvanically separated from the input, thus avoiding earth currents.

Switches for the primary and secondary windings may be MOS power transistors on the primary side. On the secondary side, with the high currents encountered, it is preferred to arrange several single windings with their own switches, coupled in parallel. Switches and windings may be TAB tape mounted on plastic foils provided with openings for the passing through of a ferrite core.

The invention will now be described more in detail by means of an illustrative embodiment which shall not be seen as limiting the invention, but which highlights some of its particularities and advantages.

DETAILED DESCRIPTION OF THE INVENTION

Figure 1:
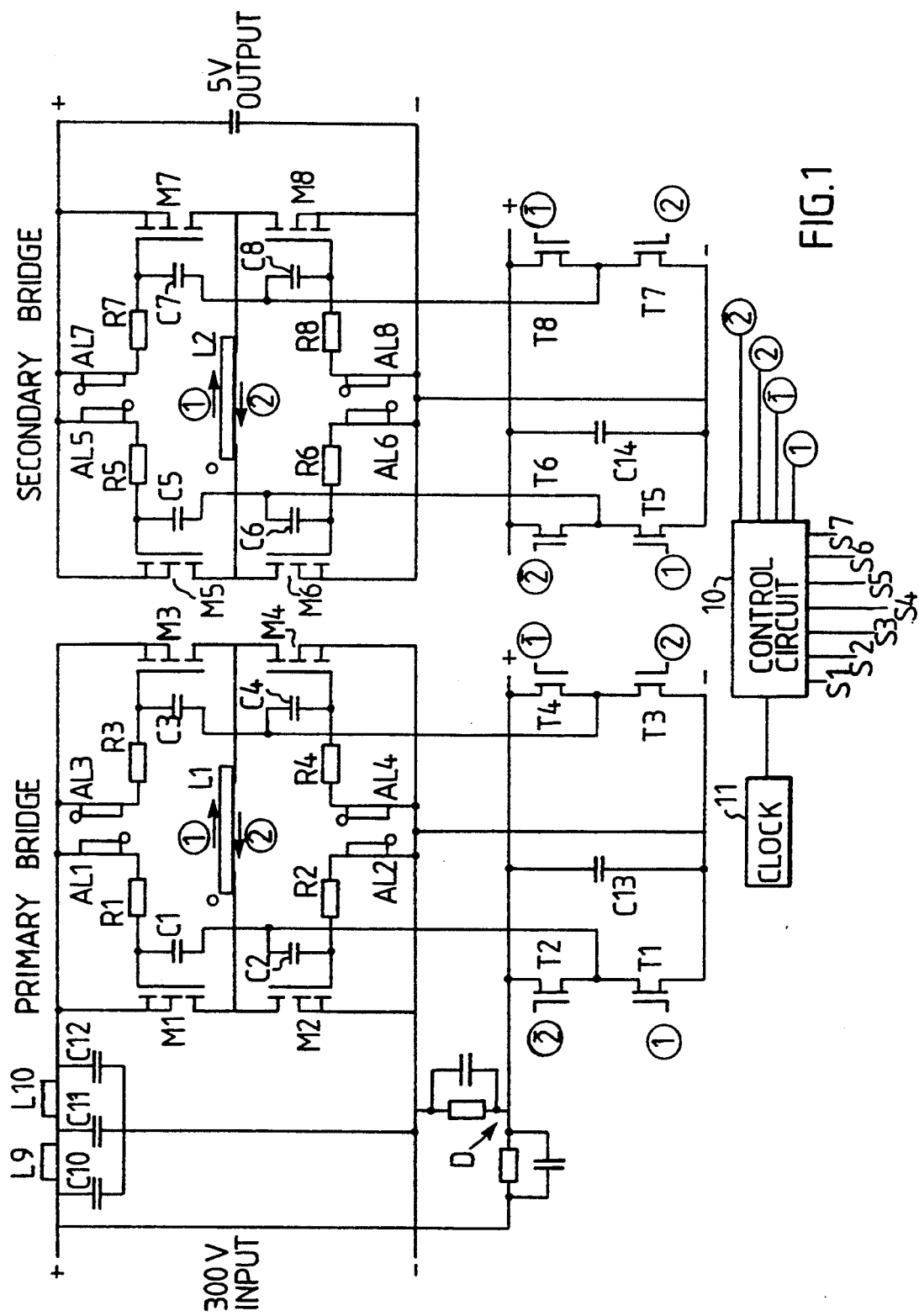
FIG. 1 shows a schematic diagram with only one of a plurality of cooperating switchable transformers, with a schematically shown control circuit therefor.

FIG. 1 shows a schematic example of one of a plurality of circuits for transforming from e.g. 300 V DC input to 5 V DC output. A ferrite transformer core (not shown) has a primary winding L1 with some 60 turns, a secondary winding of one turn and eight auxiliary windings AL1–AL8. A primary bridge is formed around the primary winding L1, comprising electronic switches M1–M4 as shown. A secondary bridge is formed around the secondary winding L2, comprising electronic switches M5–M8. The idea is to make the respective switches conduct pairwise, such that in one mode, M1 and M4 conduct, whereas in an opposite mode, M2 and M3 conduct. In a third mode, none of the switches is conducting. During the first mode, in the secondary bridge M5 and M8 are made conductive, during the second mode, M6 and M7 are made conductive. Provided that this is obtained, the secondary bridge output will, during conducting phases, show a DC voltage of 5 V. During switching times, at least another similar device (not shown in FIG. 1) will deliver the 5 V DC.

The remaining components shown in the bridges as shown in FIG. 1 participate in making the unit switch as described. The switching is triggered by respective trigger bridges comprising MOS switches T1–T4 and T5–T8 respectively. The first-mentioned trigger bridge obtains its starting energy, charging storing capacitor C13, from a voltage divider D which can have very high impedance, e.g. 300 Mohm/1 nF, and at power supply level of 10 Mohm/30 nF. Once the 300 V DC is input, therefore, the primary trigger bridge will be activatable by means of pulses at T1+T4 and T2+T3 respectively. Once made conductive, the primary bridge will create voltages over the secondary winding L2 and also over the respective auxiliary windings AL5–AL8, which are arranged in polarity to enhance the respective switchings.

The electronic switches M1–M8 are CMOS transistors, the odd-numbered ones p-channel and the even-numbered ones are n-channel.

A DC power supply according to the invention comprises two or more such transformer/bridge pairs or inverters, which cooperate. In the exemplary embodiment, there are two.

Thus, each of the two parallel inverters consists of two bridges, one on the primary and one on the secondary side of a transformer.

Each bridge forms a bistable flip-flop. Each flip-flop may be off, positive, or in negative mode. In the off mode, all transistors have zero gate-source voltage. In positive mode the bridge conducts to form a positive voltage over the transformer. In the negative case this voltage is negative. In both these cases there are only one transistor each of the n and p-channel transistors conducting.

Each bridge thus consists of two p-channel transistors M1, M3; M5, M7 near the positive rail, two n-channel transistors, M2, M4; M6, M8 near the ground rail, and a transformer. The transformer contains a main power primary and a secondary winding. There are also 4 auxiliary windings used as feedback in each flip-flop.

The auxiliary windings AL1–AL8 are formed to centre tapped windings, where the centre terminal is connected to the positive and ground rail, respectively. The winding polarity is formed in order to act like a CMOS feedback. At least on the primary bridge, the auxiliary windings are series connected by resistors R1–R4 with low resistance.

The flip-flops have the property to get in an off state if not controlled, because the gates are controlled by windings on a transformer. The gate charge is supplied by the transformer.

The primary bridge has a nominal voltage of 300 V between the positive and negative rail. The gate-source voltage is either $-5$ V, 0 V, $+5$ V. The nominal current is 0.2 A. The gates in each column of the bridge are connected by capacitors in order to control the gates. Each side has its own control signal. This signal has the same form as the output signal over the transformer.

The capacitance between drain and gate, the transistor and the input resistance of the gate driver form an integrator. In order to be able to control the flip-flop without switching losses the impedance of the driver must be low in order to always hold the gate source voltage less than the threshold voltage during transitions.

The secondary bridge has a nominal voltage of 5 V between the positive and negative rail. The gate-source voltage is either $-5$ V, 0 V, $+5$ V. The nominal current is 12 A. It uses the same type of driver as the primary bridge.

The inverters are controlled by a state machine, which is schematically shown at 10 in FIG. 1, and which has an input from a clock 11, which may be working at 250 kHz.

The oscillator is a free running ring oscillator. The frequency is phase locked to an external analog clock. The output of the oscillator is delayed approximately 0.1–0.3 cycle and sent out.

By putting all oscillators in a ring where one oscillator out put feeds the phase lock reference input all oscillators are using the same frequency and are phase shifted. By this method the transitions in the different power supplies may be spread out over a cycle. Thus the noise could be reduced.

The oscillator frequency is within $\pm 30\%$.

This state machine may consist of normal dynamic D-latches, in this example using 30 bits. 2 bits are used to determine the mode (off, on, low, overload), 3 bits for the phases of one of the inverters (off, ph0, ph1, ph2), one for "counter setting" and 27 bits arranged as a counter, which may be set by the "counter setting" bit to count either $2^{20}$ or $2^{27}$, thus creating two different overload conditions.

Figure 2:
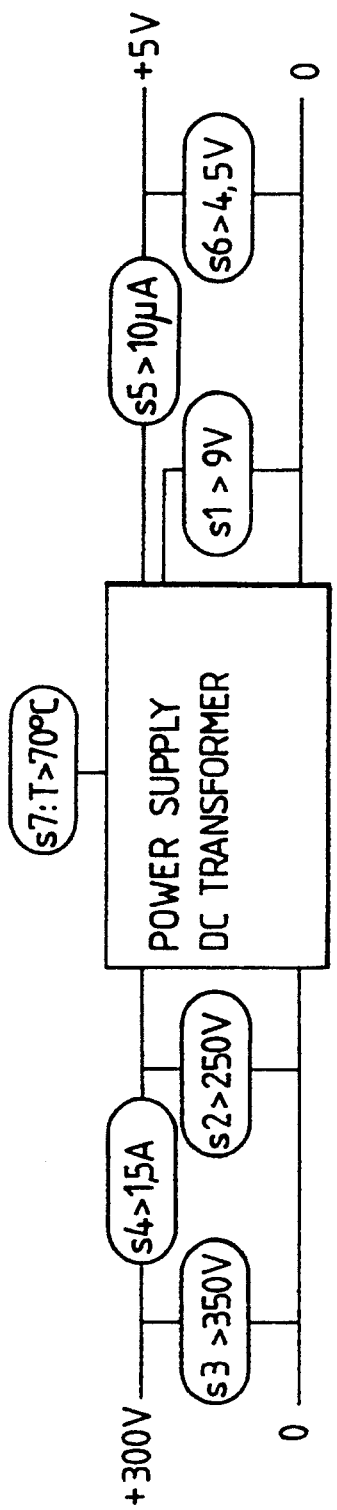
FIG. 2 shows schematically a set of sensors added in a power supply of the invention, shown as a black box.

As schematically shown in FIG. 2, the power supply has a number of sensors which are used to measure voltages and currents in the bridges. They are normal amplifiers with thresholds. The following sensors are needed:

s1 = $V_{control}$ > 9 V
s2 = $V_{300}$ > 250 V
s3 = $V_{300}$ > 350 V
s4 = $I_{300}$ > 1.5 A
s5 = $I_5$ > 10 $\mu$A
s6 = $V_5$ > 4.5 V
s7 = T > 70 C The first three voltages may be measured with the use of the static voltage divider on the control unit power supply. The following is measured as a voltage slope on the 5 V power bus.

The $I_5$ and $V_5$ sensors are isolated on the secondary side. A capacitive differential coupling is used between the two sides. An edge is used for the turning of the state of the sensor. Thus the capacitive signals are coupled directly to the set and reset inputs of a flip-flop. This flip-flop is reset at power up.

Figure 3:
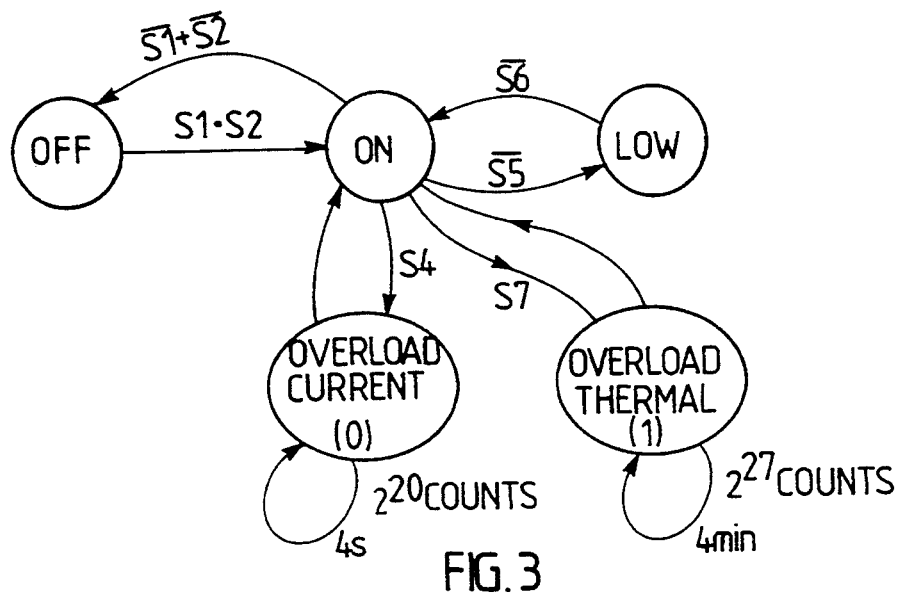
FIG. 3 is a state diagram for a control system.

As shown schematically in FIG. 1, those sensors are input to the control circuit and determine state changes according to FIG. 3.

Figure 12:
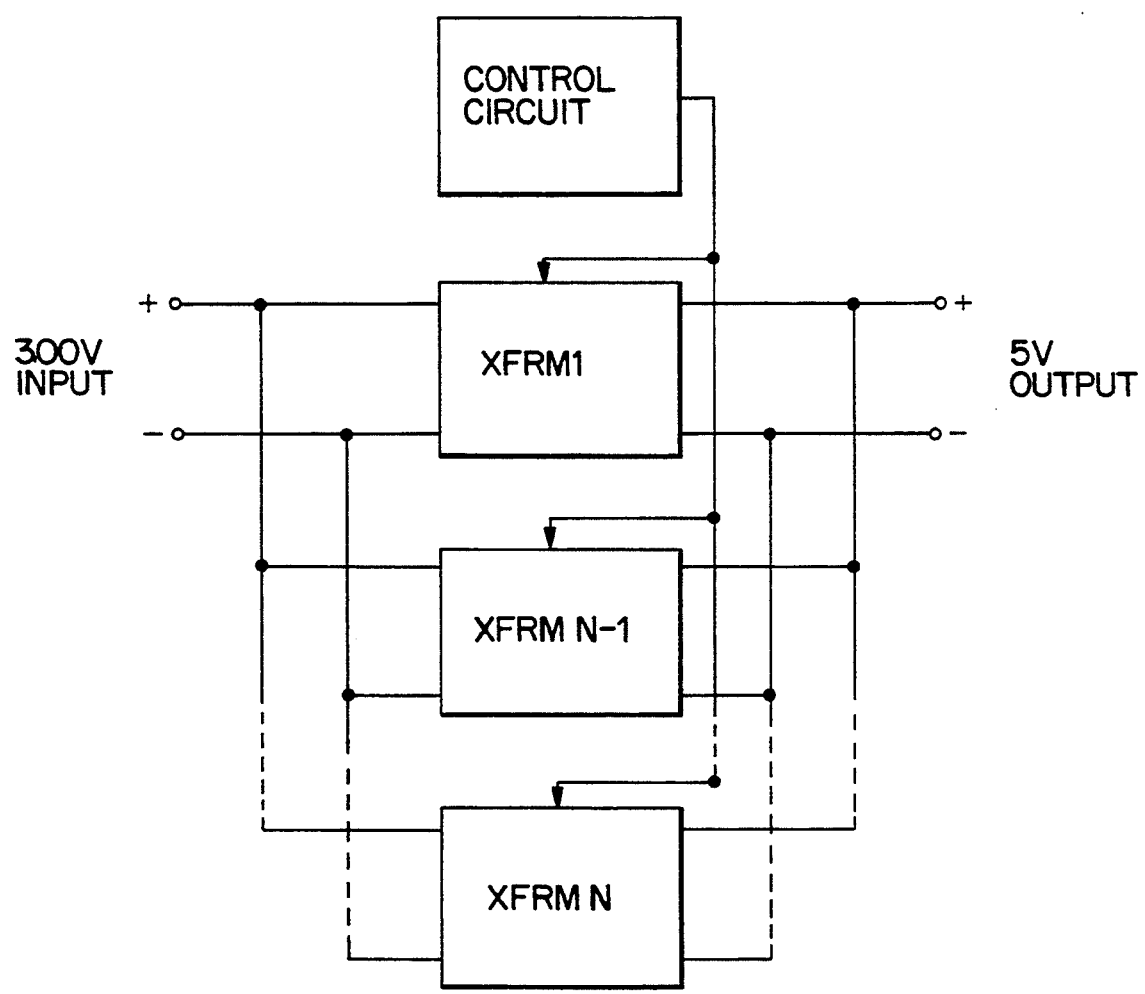
FIG. 12 is a block diagram showing a plurality of N cooperating switchable transformers and a control circuit connected thereto according to the present invention.

The state machine 10, although not so shown in FIG. 1, actually controls the plurality of voltage transformers as shown in FIG. 12 in block diagram form in the exemplary case two such units. The respective states and transitions are shown in FIG. 3, as controlled by the sensors s1-s7.

The function of the control unit is the transitions in the state diagram. The following main transitions are used:

1. the control unit power supply $V_{control} < 9$ V or the 300 V power bus voltage $V_{300} < 250$ V turns the state immediately to (off, undef). This is the transition used at start up or when power is lost.
2. in the on state the 300 V power bus current $I_{300} > 1.5$ A or the inverter temperature temp $> 80K$ the state is immediately turned to (overload 0, counter). This is the overload detection transition.

The outer transitions are synchronised by the oscillator clock.

3. in the off state when both the control unit power supply $V_{control} > 9$ V and the 300 V power bus voltage $V_{300} > 250$ V the next state is (on ph0 off, 0). This transition is the start of the inverter after power down.
4. in the on state when the output current $I_5 < 10$ μA the next state is (low, counter). This is the transition used to turn off the inverter at very small currents. Power is loaded in the charge capacitor on the 5 V bus.
5. in the low state when the 5 V power bus voltage $V_5 < 4.5$ V the next state is (on ph0 off, 0). The charged capacitor charge has been used and the capacitor charging is started.
6. when the state is ((overload $2^{20}$), 0) the overload condition is switched off to the state ((On ph0 off), 0).
7. when the state is ((overload $2^{27}$), 1) the overload condition is cleared. The new state is ((on ph0 off), 1).
8. when the state is ((on a b), 1) the fault counter is cleared. The next state is ((on a b), 0).

Figure 4:
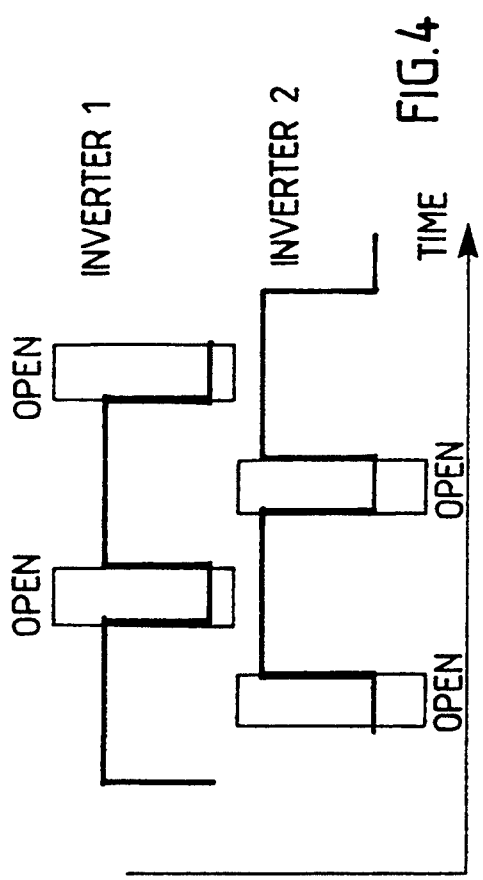
FIG. 4 schematically demonstrates the time distribution of switching intervals.

In the on state, the two units are working and delivering their respective voltages, as schematically shown in FIG. 4, from which is clear that at any particular time, at least one of the units will deliver the 5 V voltage. The "open" times are here heavily exaggerated for better understanding.

Each of the two units, when in the on state will thus alternate its switchings. The respective phases, denominated ph0, ph1, ph2, ph3 appear in FIG. 5 for the two units. A period for one unit in the on state consists in the succession of phases ph0, ph1, ph2, ph3, ph0...

Figure 5:
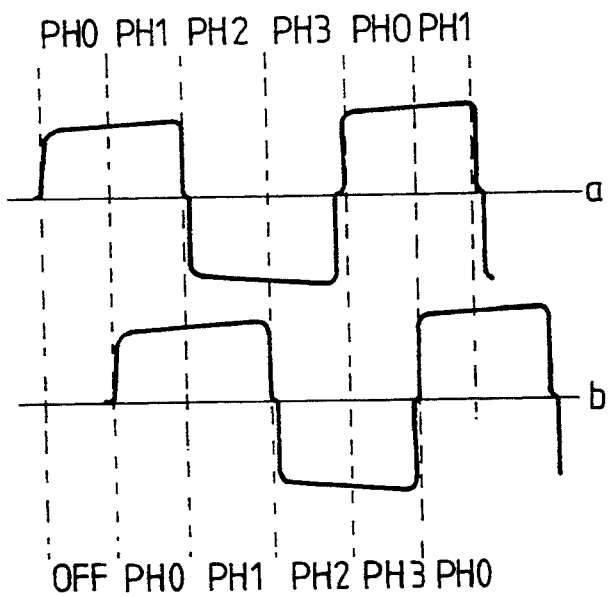
FIG. 5 shows the voltages measured over the secondary windings of two cooperating transformer units.

The second unit is then approximately one phase behind, as shown in FIG. 5, starting when a change has just been made from the off state to the on state, unit a starting at ph0, when unit b is still at off, switching to ph0 when unit a turns to ph1. As apparent, switching in each case is performed at the changes from ph3 to ph0 and from ph1 to ph2 respectively.

The following main electronic components are used in the exemplary embodiment:

| C10, C11, C12 | 100 nF |
| --- | --- |
| L9, L10 | 10 μH |

The following components are used in each of the parallel inverters:

| C1, C2, C3, C4, | 10 nF |
| --- | --- |
| R1, R2, R3, R4 | 1 ohm |
| M1, M3 | pmos |
| M2, M4 | nmos |
| M5, M7 | pmos, special |
| M6, M8 | nmos, special |
| K1 | transformer, special. |

The discrete components are surface mount chip capacitors, chip inductors and printed resistors. All wiring is on a ceramic substrate.

The control unit is one separate integrated circuit. It uses 10 V logic. The inverter secondary bridge and the sensors on the output are placed in one integrated circuit. The primary bridge is formed by four separate standard components.

There is one transformer of a very special design in each inverter.

The primary bridge uses high voltage p- and n-channel MOS power transistors. The on resistance is around 5 ohms. The transistors are controlled by −5, 0, +5 V between gate and source. The normal currents to be sustained are 0.2 A, but peaks of 1.2 A could be possible. A typical commercially available transistor characteristic is:

| | n-channel | p-channel |
| --- | --- | --- |
| $r_{on} =$ | 12 ohm | 12 ohm |
| $V_T =$ | 2.0 V | −2.0 V |
| $C_{GS} =$ | 125 pF | 375 pF |
| $C_{DG} =$ | 6 pF | 18 pF |
| $C_{DS} =$ | 7 pF | 21 pF |
| $I_D >$ | 1.2 A | −1.2 A |
| $V_{DS} >$ | 400 V | −400 V |
| $\Delta V =$ | 2.4 V | 2.4 V, 0.2 A |

The normal current through the transistors is 0.2 A. It will cause a resistive drop of 2×2.4 V. The total loss is 0.96 W.

The $V_{DG}$, $V_{DS}$ and $V_{GS}$ switches 305 V, 300 V and 10 V, respectively. They switch high capacitances with 175 kHz causing considerable losses of 1.12 W, 1.26 W and 25 mW, respectively. As shown the switching losses are dominant.

The secondary bridge, however, must use much more low impedance transistors. They are also controlled by −5, 0, and +5 V between gate and source. The on resistance is around 5 mohm and the operating voltage 5 V.

Such transistors are not commercially available. However, the voltage level and current levels are the same as in the microprocessor chips, thus normal 0.8 μm technology is used. In order to handle inductances each transistor consists of 4 parallel MOS transistors.

The sensor for 5 V power bus voltage is also integrated into this chip. The major part of the chip are the power transistors. The chip has 4 power terminals and 2 logic terminals.

| | n-channel | p-channel |
| --- | --- | --- |
| $r_{on} =$ | 9.3 mohm | 9.3 mohm |
| $V_T =$ | 0.7 V | −0.7 V |
| $C_{GS} =$ | 575 pF | 1.7 nF |
| $C_{DS} =$ | 87 pF | 263 pF |
| $C_{DG} =$ | 87 pF | 263 pF |
| $I_D >$ | 18 A | −18 A |
| $V_{DS} >$ | 5 V | −5 V |

|  |  |
|---|---|
| n-channel | p-channel |
| $\Delta V = 28$ mV | 28 mV, 3A |

The normal current through the transistors is 4×3 A. It will cause a resistive drop of 2×28 mV. The total loss is 672 mW.

The $V_{DG}$, $V_{DS}$ and $V_{GS}$ switches 10 V, 5 V and 10 V, respectively. They switch high capacitances with 175 kHz causing considerable losses of 17.5 mW, 4.4 mW and 114 mW, respectively. As shown the switching losses are negligible.

In this exemplary embodiment, a special kind of ferrite transformer is used, with planar windings on polymer sheets, which also carry most of the switching electronics using TAB (Tape Automatic Bonding) techniques. With this concept, the power supply may be made very small and provide small energy losses.

As apparent from the above, the secondary bridge as shown in FIG. 1 is in fact consisting of four such bridges in parallel, thus dividing the output current into four parallel one-turn windings, each provided with four electronic switches M4–M8.

Figure 6:
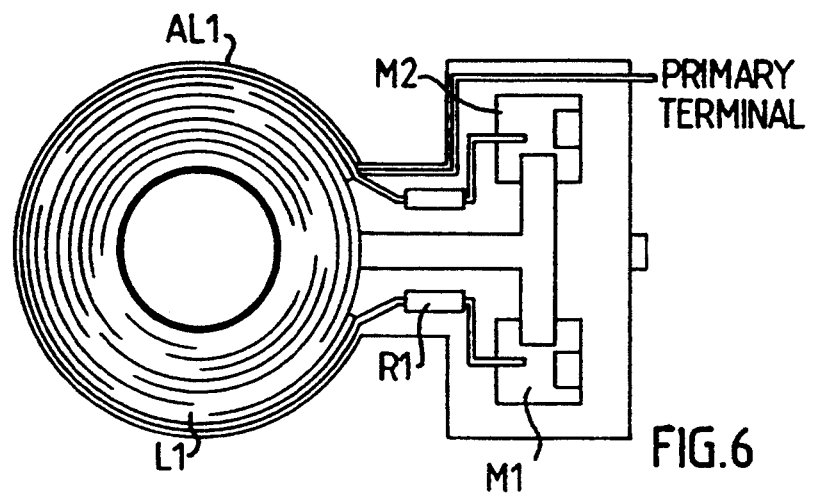
FIGS. 6 and 7 show primary and secondary windings respectively.
Figure 8:
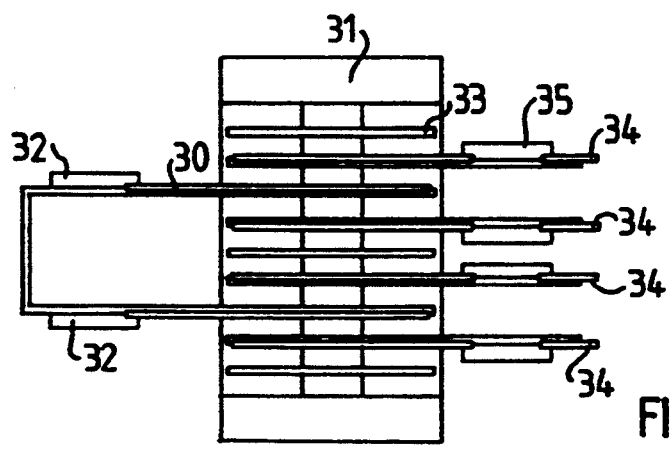
FIG. 8 shows the winding configuration on one transformer core.

The respective windings and the transformer core appear in FIG. 8, where the primary winding is mounted on a folded polyimide sheet 30 having two prongs, each having an opening through which the transformer core 31 pierces. One side of one of those prongs is shown in FIG. 6. On this side is one of the one-turn auxiliary windings, and inside there is a 15 turn spiral winding, which is continued on the underside with 15 more spiral turns, also surrounded with a further one-turn auxiliary winding. The other prong is similar, carrying two 15 turn spiral windings, each surrounded by an auxiliary winding. The four primary windings of 15 turns each are in series, making a 60 turns winding. The switches M1–M4 are comprised in the two chip units 32 (FIG. 8).

Figure 7:
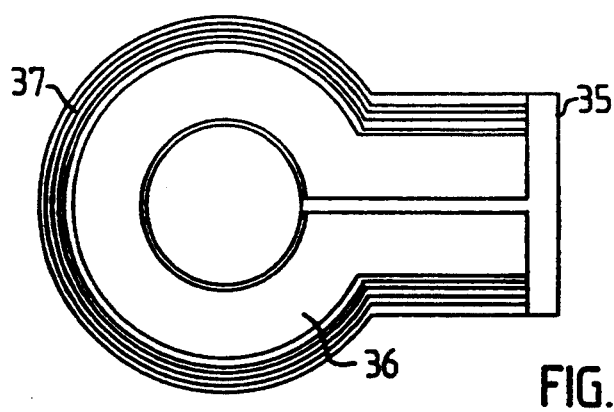

As also shown in FIG. 8, the four parallel secondary units 34 are also TAB units, having the configuration shown in FIG. 7, each with a secondary turn and four auxiliary turns outside, in this case with all the turns on one side only, each provided with the switches M5–M8 in chips 35.

The transformer is a standard RM5 ferrite core using N47 material. The core material is low loss and works well up to 1 MHz. The material is magnetised ±300 mT. The loss is 63 mW.

The secondary windings are formed by a film of 125 $\mu$m polyimide and on each side plated with 70 $\mu$m Cu. Four identical such sheets are used. They are placed on top of each other and the core centre is threaded through a hole in the middle. On one side there are 15+1+1+1+1 turns for the primary winding, and on the other side there are 1+1+1+1+1 turns for the secondary windings. All windings are placed coaxial to each other.

The film has an outer diameter of 10.1 mm, and inner diameter of 5.0 mm. Between them the windings are placed. The auxiliary windings are all 0.1 mm wide. The main winding is 1.95 mm. All separations are 50 $\mu$m. The primary winding has a conductor width equal to 0.1 mm. Because of the use of thin wires the skin effect is negligible. The windings have the following characteristics:

| primary: | |
|---|---|
| 4 × 15 turns | |
| area = 70 × 100 $\mu$m, | length = 1.43 m |
| R = 3.68 ohm | $L_p$ = 3.99 mH |
| P = 147 mW | $\Delta V$ = 740 mV, 0.2 A |
| secondary (4 parallel): | |
| 1 turn | |
| area = 70 × 1_950 $\mu$m | length = 24.0 mm |
| R = 3.16 mohm, | $L_s$ = 3 nH |
| P = 50.5 mW | $\Delta V$ = 12.6 mV, 4 A |
| auxiliary (8 identical): | |
| 1 turn, | |
| area = 70 × 100 $\mu$m | length = 24.0 mm |
| R = 62 mohm, | $L_s$ = 3 nH |

The winding sheet also works as a TAB tape for mounting the power transistors. The transformer contains 9 polyimide sheets. There are 4 sheets 34 used for the output bridge, two (30 folded) for the input bridge and three (as 33) used for isolation (FIG. 8).

The sheets for the input bridge comprise only one folded sheet 30. Thus, the entire winding (60+4×1 turns) and all wires, 4 power MOS transistors, and 4 resisters are placed on the sheet. The resisters are formed by plated wires. Therefore, the sheet has only two power terminals and four control terminals. The terminals are formed like ribbon cables. They are bonded to a ceramic control unit substrate.

Figure 9:
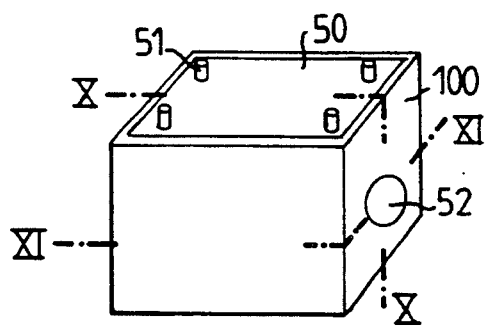
FIGS. 9–11 show an embodiment of the invention, as mounted on a cooling fin into a single component.
Figure 10:
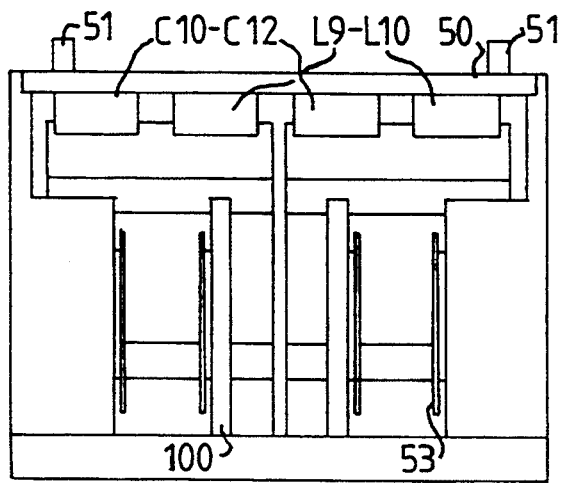
Figure 11:
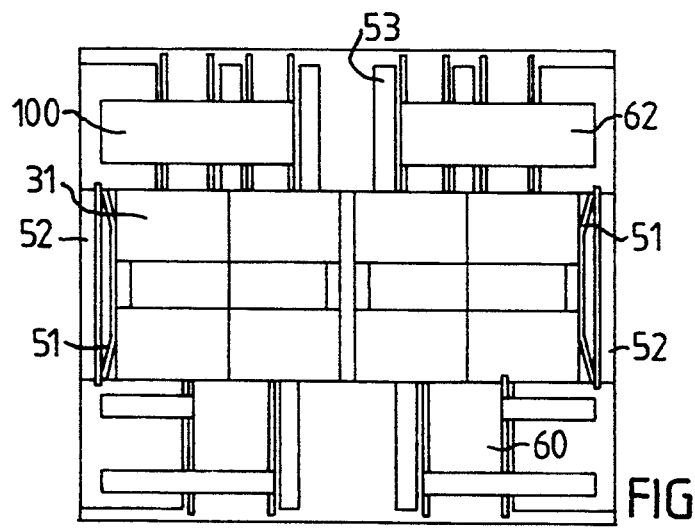

The two units so constituted are mounted in one main cooling fin 100 having generally U form, making a full unit of dimensions 25×22×20 mm as schematically shown in FIG. 9 and having the four kovar terminals 51 on top as shown, mounted on top of a ceramic substrate 50, which carries on the underside all discrete components, as capacitors C10–C12 and inductors L9, L10 (FIG. 1) together with the control unit chips, as shown in FIG. 10, which shows a sectional X-ray view as of X—X in FIG. 9. The ferrite cores 31 are entered through holes locked by springs 51 and lids 52 as shown in FIG. 11, which is a sectional X-ray view as of XI—XI in FIG. 9.

In comparison with FIG. 8, it appears that the respective chips 32 and 35, mounted on the polymer sheets which form the windings, are affixed to 2×6 towers formed inside the cooling fin, wherein U-shaped openings are made, and where the power transistors are fastened by an epoxy as at 53. As compared to FIG. 8, it appears in FIG. 11 that the switches of the primary bridges, as 60, are turned in one direction relative to the core 31 and those of the secondary bridges in the other direction, and the respective secondary switches are joined by flexible leads 62, which are led to the underside of the ceramic substrate 50.

Thus, the substrate 50 carries on its underside the input filter inductors and capacitors, an output storage capacitor, the 16 capacitors for the secondary control wires, the two local power storage capacitors C13, C14 for the control units, the two control unit chips (comprising T1–T4 and T5–T8 respectively), and the DC voltage divider D for the primary control unit.

The dominating loss is in the primary bridge switching transistors. At normal lead 60 W, the efficiency is about 93%. At peak power 360 W, the losses have increased to 73 W and the efficiency decreased to 79.6%.

The normal output resistance is 3.6 mohm. It results in a voltage drop of 43.2 mV at normal load. At peak loads of 360 W the drop is 260 mV.

What has now been described is a DC low-voltage source having two intermittently working "voltage transformers", where their necessary switching intervals never coincide, such that they work in tandem. The same principle may be used for arranging any number of units as shown in FIG. 12 in block diagram form. With only two units, the active unit will have to carry double load when the other one is inactive. A higher number of units, where at no time more than one is inactive will accordingly mean a proportionately lower extra load on the others. By this arrangement, a voltage is always present without any dip at transitions. There is no need for energy storage in capacitors, inductors or the like.

Unless there is always some capacitive load, it is preferred to arrange for a small output capacitor for storage during quiescent load conditions. The power supply may then be switched off by the state machine described, diminishing the relative energy loss very much.

The filter at the input side (L9–L12; C10–C12, FIG. 1) will be able to take up even very fast surge currents on the secondary side, thus protecting the mains from disturbances. A 100 nF capacitor for 300 V has reasonable size and low parasitic inductance, whereas a 360 $\mu$F capacitor as would be needed at the 5 V side, would be much larger and have an impossibly high parasitic inductance, making it impossible to cope with surges at e.g. 20 MHz.

The invention therefore possesses very favourable properties for feeding large currents at low voltage for demanding circuits, e.g. in computers. Such devices generally do not need stabilized voltage, and it is therefore proposed to feed one or more inventive low-voltage DC supplies by a 300 V bus, which may be fed from an ordinary 6-pulse rectifier directly connected to a 3-phase mains source. The mains ripple will follow through but will in general be of no consequence. In a total system, the 300 V bus may be provided with a battery source for protection against mains failure. Further, due to the small dimensions possible, the inventive inverter/DC-transformer enables the avoidance of long low-voltage leads, as several such units may be distributed, fed by a single 300 V bus, which will create much less electronic noise than with the alternative of long 5 V buses carrying surge currents at several MHz.

I claim:

1. A low-voltage DC power supply having a DC voltage input and a DC low voltage output, each of said input and output having a positive and a negative terminal, said power supply comprising a plurality of transforming units, and a clock means for generating a clock pulse sequence, said clock means being connected to a control means common to each of said transforming units;

each of said plurality of transforming units comprising a transformer core provided with a primary winding, a secondary winding and a plurality of controllable switch means controlled by said common control means for performing switching operations connecting said positive and negative terminals of the DC voltage input with alternating polarity to said primary winding, and for connecting said positive and negative terminals of the DC low voltage output to said secondary winding alternatingly such that for each of two polarities of voltage fed to said primary winding, the voltage thereby induced in the secondary winding is switched for connecting always with equal polarity to said positive and negative terminals of said DC low voltage output;

said plurality of transforming units being controlled by said common control means to perform switch operations on individual ones of said plurality of transforming units non-simultaneously to selectively connect and disconnect each of said transforming units to said DC voltage input and to said DC low voltage output, such that during each switch operation performed on any one of said transforming units, at least one other of said plurality of transforming units is connected to said DC low voltage output and non-switching, and delivers a low voltage potential across said positive and negative terminals of said DC low voltage output.

2. A low-voltage DC power supply of claim 1, wherein a filter circuit (L9, L10, C10–C12) is arranged at the said DC input.

3. A low-voltage DC power supply of claim 1, wherein each of said controllable switching means has a control electrode, connected to one end of an auxiliary winding (AL1–AL8) in the transforming unit, the other end being connected to one of the leads constituting the DC input and output respectively.

4. A low-voltage supply of claim 1, wherein said connection network comprises a primary bridge comprising the primary winding (L1) and a secondary bridge comprising the secondary winding (L2), each said bridge comprising four separately controlled electronic valves, each of which has a conducting and a non-conducting state.

5. A low-voltage supply of claim 4, wherein the said valves are MOS transistors.

6. A low-voltage supply of claim 4, wherein the said valves are bipolar transistors.

7. A low-voltage supply of claim 4, wherein the common control network is arranged to switch periodically such that a period for conduction of a primary bridge contains a period for conduction of the corresponding secondary bridge, such that at flanks of conduction change no load is present on the secondary winding thereof.

8. A low-voltage supply of claim 7, wherein bridge switching is controlled by an LC circuit formed by the transforming unit inductance and a capacitance comprising a stray capacitance and optionally a material capacitance over the transformer.

9. A low-voltage supply of claim 1, wherein the transformer core is a ferrite material core and that the respective windings consist of plated material on a thin isolating carrier.

10. A low-voltage supply of claim 9, wherein the windings comprise winding turns on two opposing sides of said carrier.

11. A low-voltage supply of claim 10, wherein said primary winding comprises spirally arranged leads on opposing sides of a said carrier, which have each a circumferential terminal and the internal respective ends of the spirals are mutually connected over the thickness of the thin carrier.

12. A low-voltage supply of claim 9, wherein said thin isolating carrier is a polymer film.

13. A low-voltage supply of claim 9, wherein said thin isolating carrier is a ceramic wafer.

14. A low-voltage supply of claim 12, wherein said plastic film is folded for obtaining a plurality of layers.

15. A low-voltage supply of claim 14, wherein said layers are insulated by interfoliating and outwardly insulating layers.

16. A low-voltage supply of claim 1, wherein said control network is arranged to disable conduction at moments of low load current, a small charge store being furnished by a separate parallel capacitor.

17. A low-voltage supply of claim 4, wherein said common control network comprises two separate driver stages (T1–T4; T5–T8), one for the primary bridge and one for the secondary bridge.

18. A low-voltage supply of claim 17, wherein said driver stages are connected to said bridges via capacitors (C1–C8).

19. A low-voltage supply of claim 17, wherein said driver stages are transformer connected to said bridges.

20. A low-voltage supply of claim 17, wherein a single transformer core is utilized for all said windings of each transforming unit.

21. A low-voltage supply of claim 17, wherein each said transforming unit instrumental both for bridge control and for feeding energy to said driver stages and common control network.

22. A low-voltage supply of claim 14, wherein a single folded film carries all windings for the primary bridge.

23. A low-voltage supply of claim 22, wherein said controllable switch means (M1–M8) are mounted on a ceramic substrate.

24. A low-voltage supply of claim 23, wherein said ceramic substrate is mounted in contact to an outer cooling sink means.

25. A low-voltage supply of claim 23, wherein said ceramic substrate is in contact with a metal capsule.

26. A low-voltage supply of claim 1, wherein all said transforming units are integrally mounted in a mechanical unit.

27. The low-voltage DC power supply according to claim 1, wherein said plurality of transforming units comprises more than two transforming units, and wherein said plurality of transforming units are controlled by common control means such that during each switch operation performed on any one of said transforming units, all others of said plurality of transforming units are connected and non-switching.

* * * * *